United States Patent
Langouet et al.

(10) Patent No.: US 6,882,138 B2
(45) Date of Patent: Apr. 19, 2005

(54) MODULAR TEST ADAPTER FOR RAPID ACTION ENGAGEMENT INTERFACE

(75) Inventors: Luc Jean Langouet, Fishersville, VA (US); Eric H. Marion, Fishersville, VA (US); Jeffery Stowers, Mont Sidney, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 129 days.

(21) Appl. No.: 10/042,332

(22) Filed: Jan. 11, 2002

(65) Prior Publication Data

US 2003/0132743 A1 Jul. 17, 2003

(51) Int. Cl.⁷ .............................................. H02B 1/00
(52) U.S. Cl. ................................. 324/158.1; 361/600
(58) Field of Search .......................... 324/158.1, 156; 439/346, 345, 350–355, 357, 358; 361/600, 679, 724–726, 728; 312/293.1, 293.3, 223.1, 223.2

(56) References Cited

U.S. PATENT DOCUMENTS

| | | |
|---|---|---|
| 4,213,666 A | 7/1980 | Braginetz et al. |
| 4,219,935 A | 9/1980 | Braginetz et al. |
| 4,296,990 A | 10/1981 | Stowers et al. |
| 4,329,005 A | 5/1982 | Braginetz et al. |
| 4,417,206 A | 11/1983 | Stowers |
| 4,537,463 A | 8/1985 | Coiner et al. |
| 4,571,540 A | 2/1986 | Stowers et al. |
| 4,626,780 A | 12/1986 | Powers et al. |
| 4,667,155 A | 5/1987 | Coiner et al. |
| D299,715 S | 2/1989 | Stowers et al. |
| 4,963,104 A | 10/1990 | Dickie |
| 4,981,440 A | 1/1991 | Werner et al. |
| 5,046,967 A | 9/1991 | Majernik et al. |
| 5,080,604 A * | 1/1992 | Rider et al. .................. 439/357 |
| 5,103,378 A | 4/1992 | Stowers et al. |
| 5,227,718 A | 7/1993 | Stowers et al. |
| 5,420,519 A | 5/1995 | Stowers et al. |
| 5,576,631 A | 11/1996 | Stowers et al. |
| 5,588,853 A | 12/1996 | Anthony |
| 5,609,492 A | 3/1997 | Sato et al. |
| 5,633,597 A | 5/1997 | Stowers et al. |
| 5,788,534 A | 8/1998 | Koegel et al. |
| 5,850,147 A | 12/1998 | Stowers et al. |
| 5,936,421 A | 8/1999 | Stowers et al. |
| 5,942,906 A | 8/1999 | Stowers et al. |
| 5,966,023 A | 10/1999 | Burgers et al. |

* cited by examiner

*Primary Examiner*—David Zarneke
*Assistant Examiner*—Russell M. Kobert
(74) *Attorney, Agent, or Firm*—24Ip Law Group USA, PLLC; Timothy R. DeWitt (57) ABSTRACT

A modular interface test adapter having a base, a cover and a bushing or card support that permits easy access to modules, pins and patchcords in the test adapter for activities such as troubleshooting and repairs. The cover is removable and has a structure, such as a tongue and groove, for mating with a corresponding structure in a base. The bushing or card support is removable from the cover.

8 Claims, 12 Drawing Sheets

MODULAR TEST ADAPTER FOR RAPID ACTION ENGAGEMENT INTERFACE

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of the Invention

The invention relates broadly to an interface connection system, and more particularly to a rapid action engagement interface connection system. Such connection interface equipment requires the frequent placement of interchangeable test adapters (ITA) or wiring modules with multiple minute electrical contacts in operative engagement with opposite co-acting electrical contacts of, for example, receiver modules. It is imperative that the receiver contacts and interchangeable test adapter/wiring contacts engage with precision to minimize wear and to prevent damaging the delicate and expensive equipment.

2. Description of the Related Art

The present invention relates to improvements made upon a prior invention disclosed in U.S. Pat. No. 5,966,023 which is hereby incorporated by reference, and several other patents commonly assigned to Virginia Panel Corporation. In those prior patents, a rapid action engagement connection interface system was provided which positioned and electrically connected a testing device to a device under test. The testing device exercised and tested the device under test. The rapid action engagement connection interface system in those prior patents included a receiver (or receiver module) electrically connected to the device under test and included at least one receiver electrical connector. The receiver included a receiver main body section accommodating at least one receiver electrical connector. The receiver main body had upper and lower receiver sections and first and second receiver sides.

The receiver also included a pivot tab or receptacle, connected to, or integral with, the lower receiver section of the receiver main body section, first and second fin-shaped guides, connected to, or integral with, the first and second receiver sides, respectively, and a locking latch mechanism disposed on the upper receiver section of the receiver main body section.

The rapid action engagement connection system also included an interchangeable test adapter electrically connected to the device under test, removably couplable to the receiver and including at least one test electrical connector. The interchangeable test adapter included a test main body section accommodating the test electrical connector, and a pivot tab receiver (or pivot receptacle receiver), connected to, or integral with, the lower test section of said test main body section. The interchangeable test adapter included first and second fin-shaped grooves, connected to, or integral with, the first and second test sides, and a locking latch receiver disposed on the upper test section of said test main body section.

Figure 1:
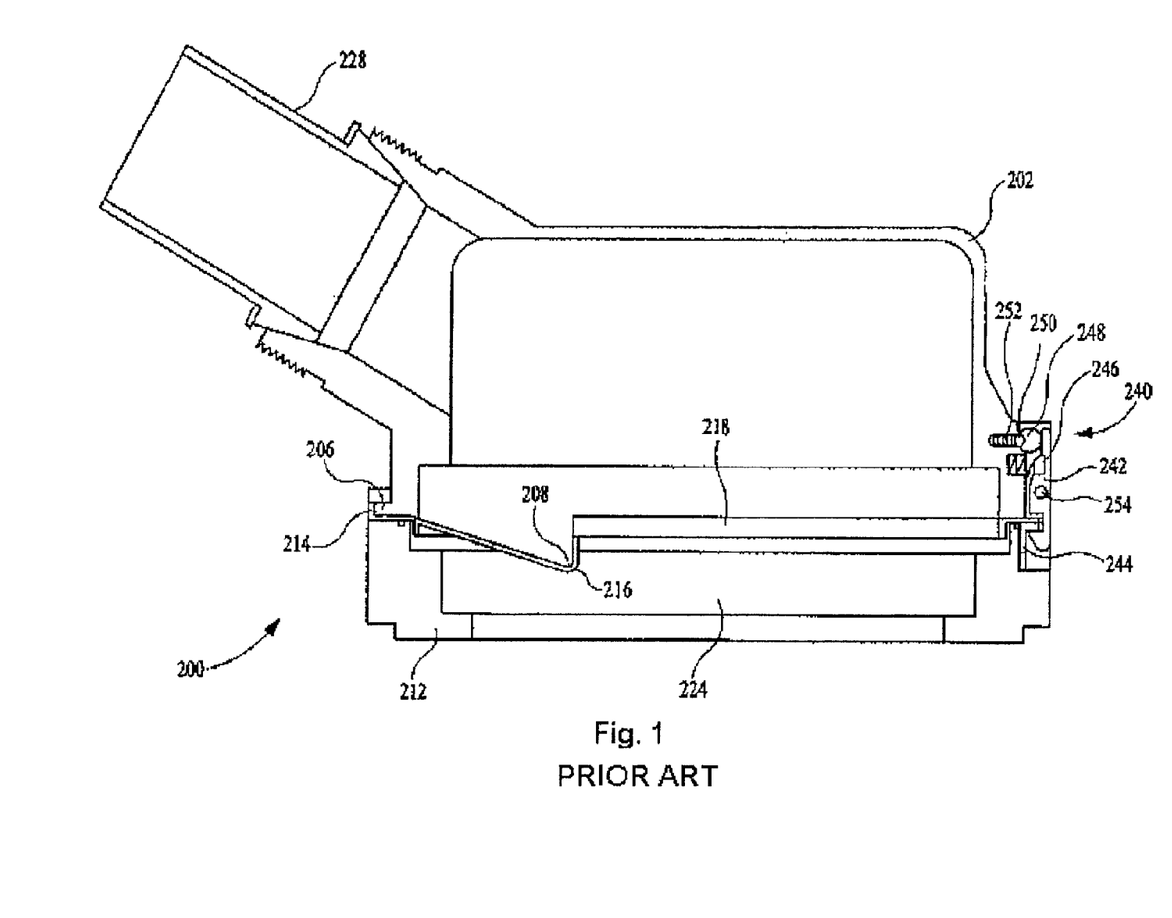
FIG. 1 is a partial sectional side view of a prior art non-modular rapid action engagement interface connection system.
Figure 2:
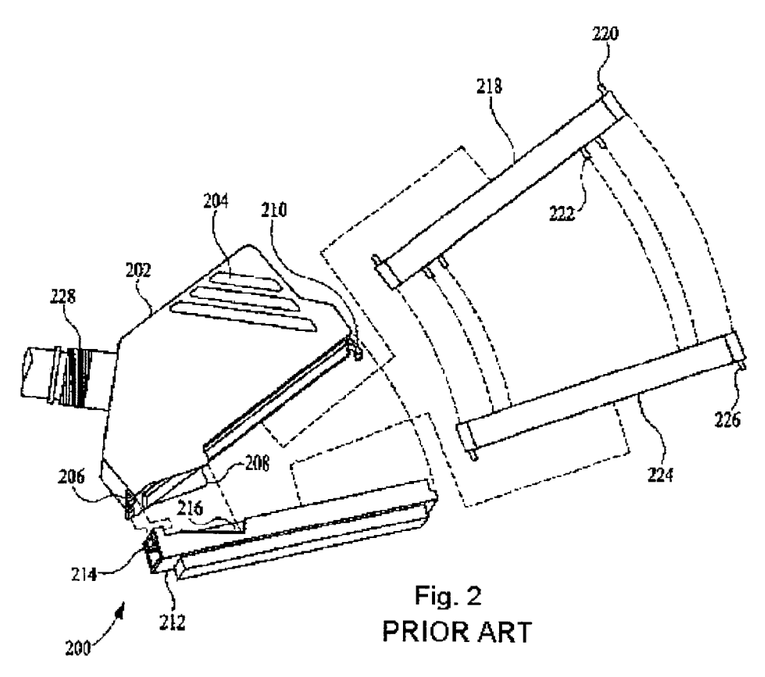
FIG. 2 is an isometric view of a prior art non-modular rapid action engagement interface connection system.

When the pivot tab engages the pivot tab receiver, the receiver was pivotally engagable with the interchangeable test adapter. The receiver was pivotally guided into engagement with the interchangeable test adapter utilizing the first and second fin-shaped guides that are introduced into the first and second fin-shaped grooves respectively. The receiver was secured to the interchangeable test adapter utilizing the locking latch mechanism and the locking latch receiver. An example of the device disclosed in the prior patent is shown in FIGS. 1 and 2.

In another embodiment disclosed in the prior patents, a rapid action engagement interface connection system was provided for positioning and electrically connecting a testing device to a device under test. The testing device exercised and tested the device under test. The rapid action engagement interface connection system included a receiver electrically connected to the device under test and included at least one receiver electrical connector.

The receiver included a receiver main body section accommodating the at least one receiver electrical connector. The receiver main body had upper and lower receiver sections and first and second receiver sides.

The receiver included a pivot tab or receptacle, connected to, or integral with, the lower receiver section of the receiver main body section, first and second guides, connected to, or integral with, the first and second receiver sides, and a locking latch mechanism disposed on the upper receiver section of the receiver main body section. The rapid action engagement interface connection system also included an interchangeable test adapter electrically connected to the device under test, removably couplable to the receiver and included at least one test electrical connector.

The interchangeable test adapter included a test main body section accommodating at least one test electrical connector, and a pivot tab receiver, connected to, or integral with, the lower test section of the test main body section. The interchangeable test adapter included first and second guide receivers, connected to, or integral with, the first and second test sides, and a locking latch receiver disposed on the upper test section of the test main body section.

In another embodiment disclosed in the prior patents, a method of positioning and engaging a test electrical connector with a receiver electrical connector using a rapid action engagement interface connection system was provided. The method included the steps of mounting the test electrical connectors to the interchangeable test adapter, mounting the receiver electrical connectors to the receiver, and engaging a pivot tab of the receiver with a pivot tab or pivot receptacle receiver of the interchangeable test adapter.

The method also included the steps of pivotally guiding and engaging the interchangeable test adapter with the receiver via the pivot tab and the pivot tab receiver, thereby engaging the test electrical connector to the receiver electrical connectors, and locking the interchangeable test adapter with the receiver via a locking mechanism.

Although these devices generally functioned well and provided advantages over prior devices, the devices did not provide users with convenient access to the connectors and wires of a test adapter after the test adapter had been assembled. Such access may be desirable to perform troubling shooting tasks and repairs on the test adapters. One suggested method of obtaining access to assembled test adapters was to cut the test adapters in half along the length of the test adapter and then provide screws to hold the two halves together. This suggested modification of the test adapters suffered from numerous shortcomings, such as weakening the test adapter and failing to provide sufficiently convenient access to the contacts and wires within the assembled adapter.

SUMMARY OF THE INVENTION

The present invention has been made in view of the above circumstances and has as an object to provide an improved connection interface system that provides easier access to contacts and wiring for troubleshooting and repairs.

A further object of the invention is to provide a modular interface system in which various components may be interchanged or replaced without replacing the entire test adapter.

To achieve these goals, the present invention comprises a test adapter having a cover, a base, and a bushing that are separable from each other. More specifically, a preferred embodiment of the modular interface test adapter of the invention comprises a base comprising a means for accommodating at least one electrical connector, at least one pivot tab projecting therefrom, a fin-shaped guide for guiding the base into a receiver, a locking latch mechanism; and a tongue and groove structure; a cover having a tongue and groove structure for mating with said tongue and groove structure of said base; wherein said cover is removable from said base; and a bushing comprising a housing having an opening therein for receiving electrical cables, means for securing said housing to said base or said cover; and a clamp for securing electrical cables in said opening in said housing; wherein said bushing is separable from said cover and said base.

Additional objects and advantages of the invention will be set forth in part in the description which follows and in part will be obvious from the description, or may be learned by practice of the invention.

BRIEF DESCRIPTION OF THE DRAWINGS

The accompanying drawings, which are incorporated in and constitute a part of this specification illustrate some embodiments of the invention and, together with the description, serve to explain the objects, advantages, and principles of the invention. In the drawings.

FIGS. 6(a), (b), (c), and (d) are side, front, top, and cross-sectional views of a bushing of a modular test adapter in accordance with a preferred embodiment of the present invention.

DETAILED DESCRIPTION OF THE PREFERRED EMBODIMENTS

A preferred embodiment of the modular test adapter of the present invention is shown in FIGS. 3–10. The modular test adapter of this preferred embodiment has three primary components: a base 400, a cover 500, and a bushing 600. Other embodiments, of course, may have two primary components or more than three primary components.

Figure 4A:
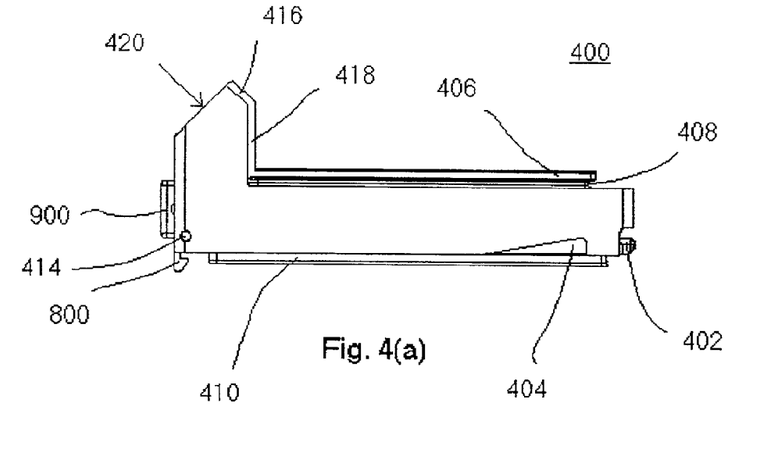
FIGS. 4(a), (b), and (c) are side, front, and cross-sectional views of a base of a modular test adapter in accordance with a preferred embodiment of the present invention.
Figure 4B:
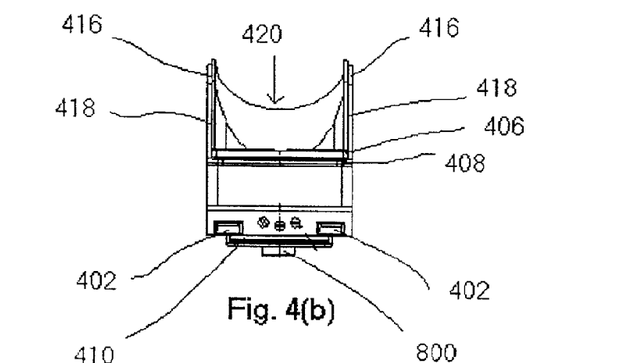
Figure 4C:
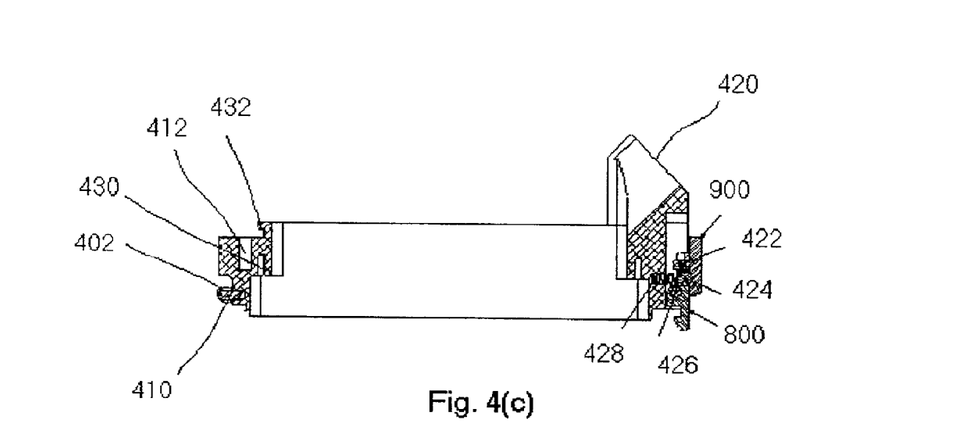

A base of a preferred embodiment of the modular test adapter is shown in FIGS. 4(a)–(c). The base 400 has tabs or feet 402 projecting from one end that are placed into receptacles in a receiver 300 for engagement of the test adapter into the receiver. The end of base 400 with the projecting tabs or feet 402 additionally has a keying screw 410, a threaded screw hole 412, module location holes 430, and a tongue 432. The bottom of base 400 has a guide or fin 410 that may be used during engagement of the modular test adapter with a receiver.

On an end opposite the tabs or feet 402, the base 400 has a locking mechanism, which, as shown in FIG. 4(c), includes a latch 800, a pin 414, a cylinder 422, a locking ball 424, a pivot 426, a spring 428, and a latch lock 900. The latch is shown in greater detail in FIGS. 8(a)–(c).

The top of the base 400 has a tongue 406 and groove 408 structure for receiving a cover 500. The end of the tongue and groove structure 406, 408 opposite the portion projecting from the top of the base 400 is open for receiving a corresponding tongue and groove structure in a cover 500. The base 400 further has a portion projecting from its top that includes recessed portions 416, 418 also for receiving a cover. The projecting portion has a curved section 420 that when combined with a cover 500 forms and opening in the test adapter for patchcords (not shown) to pass through. Each side of the base 400 has a fm or guide 404 that are engaged with fin-shaped grooves in a receiver when the test adapter is mated with the receiver. The base may be made of any number of different materials, but preferably is made of aluminum.

Figure 5A:
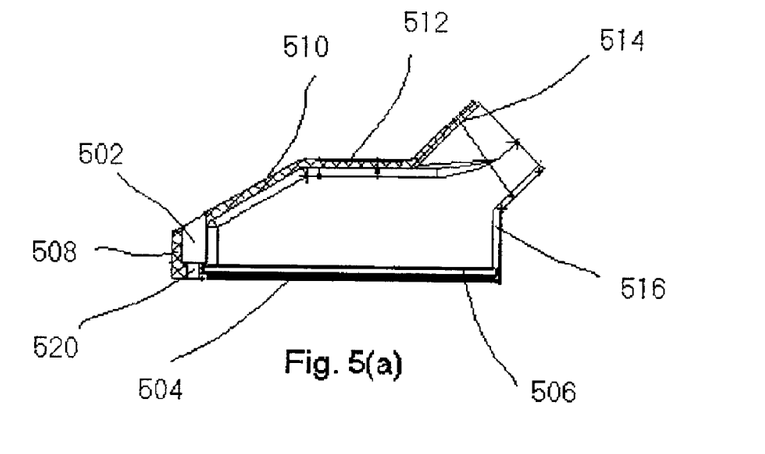
FIGS. 5(a), (b), and (c) are cross-sectional, front, and top views of a cover of a modular test adapter in accordance with a preferred embodiment of the present invention.
Figure 5B:
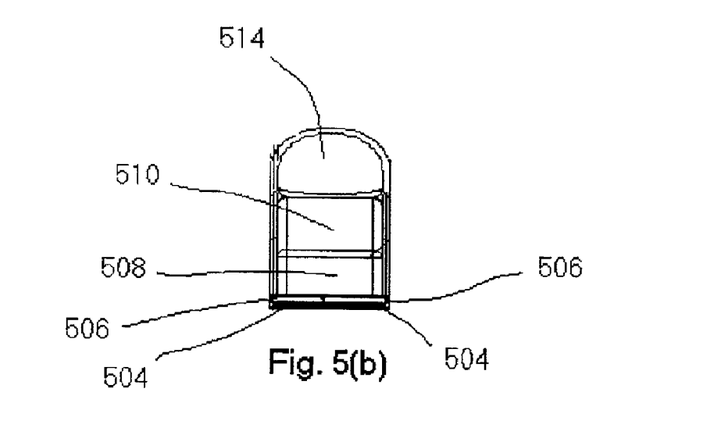
Figure 5C:
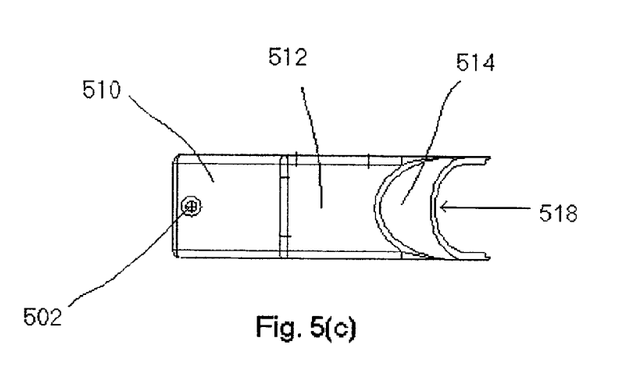

A cover 500 of a preferred embodiment of the invention is shown in FIGS. 5(a)–(c). The bottom of the cover 500 has a tongue 504 and groove 506 structure for attaching the cover 500 to the base 400. To attach the cover 500 to the base 400, the tongue and groove structure 504, 506 of the cover 500 had an open end that is aligned with the open end of the tongue and groove structure 406, 408 on the base. The cover 500 then slides onto the base 400 and is secured to the base by placing a screw through an opening 502 and through hole 520 near the front 508 of the cover 500 and into the threaded screw hole 412 in the base 400. The cover 500 in the preferred embodiment has an angled portion 510 extending from the front 508 of the cover 500 to a flat top section 512. This shape, however, is not necessary and the cover may be in many other shapes. The flat top section then extends to a neck 514 that includes an arched portion 518 that aligns with the arched portion 420 of the base 400 to receive a bushing or collar 600. The back 516 of the cover 500 has a recessed structure that corresponds to the recessed structure 416, 418 of the base 400 when the cover is on the base. The cover may be formed of any number of materials but preferably is formed of plastic.

Figures 6A, 6B:
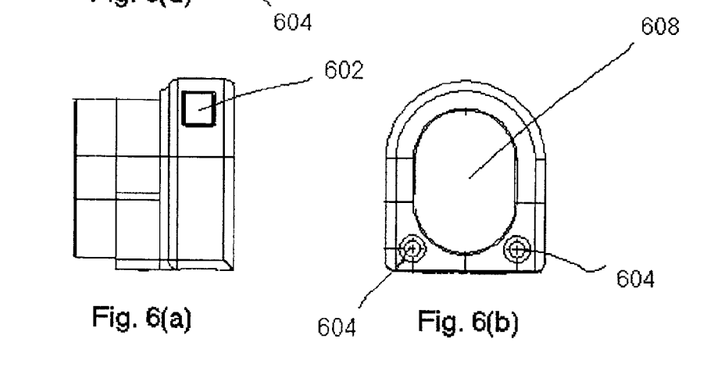
Figure 6C:
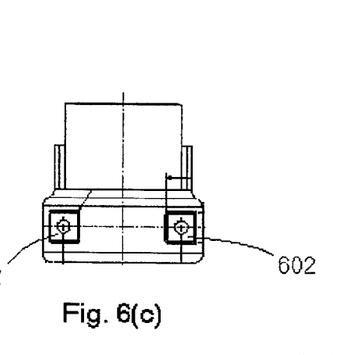
Figure 6D:
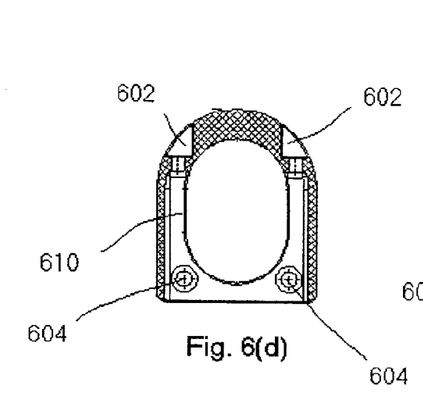
Figure 7A:
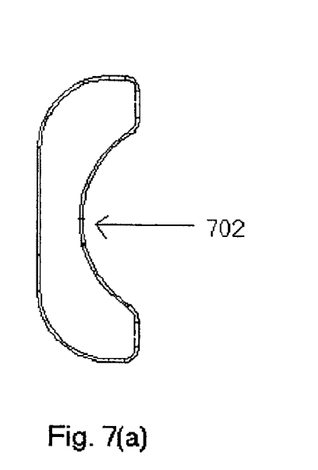
FIGS. 7(a), (b), and (c) are cross-sectional, bottom, and side views of a cable clamp of a modular test adapter in accordance with a preferred embodiment of the present invention.
Figure 7B:
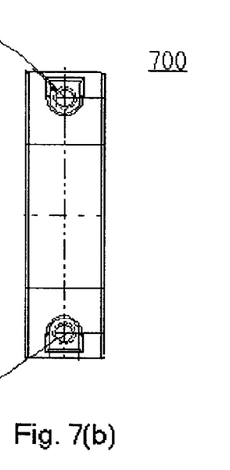
Figure 7C:
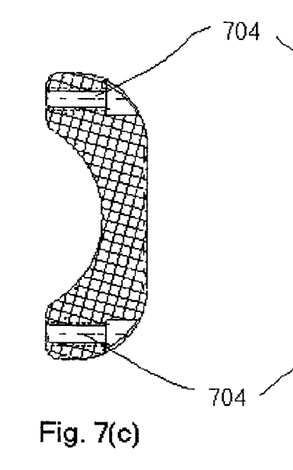
Figure 8A:
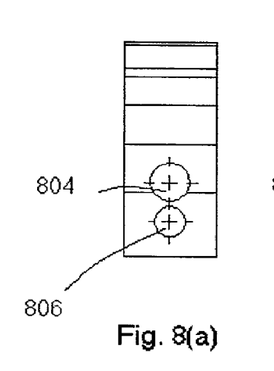
FIGS. 8(a), (b), and (c) are front, side, and back views of a latch of a modular test adapter in accordance with a preferred embodiment of the present invention.
Figure 8B:
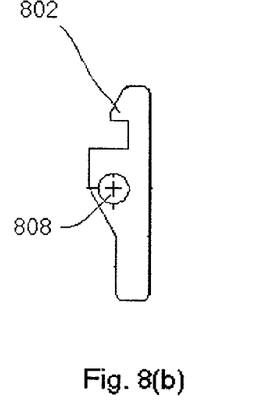
Figure 8C:
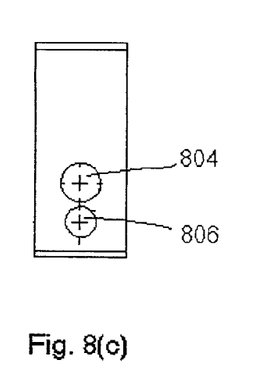
Figure 9A:
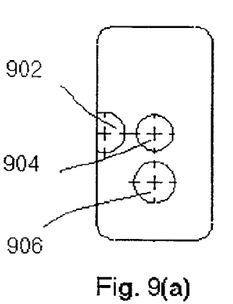
FIGS. 9(a), (b), (c), and (d) are front, side, back, and cross-sectional views of a latch lock of a modular test adapter in accordance with a preferred embodiment of the present invention.
Figure 9B:
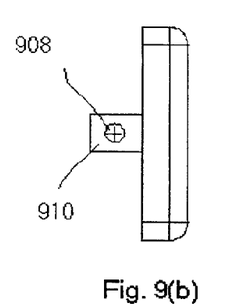
Figure 9C:
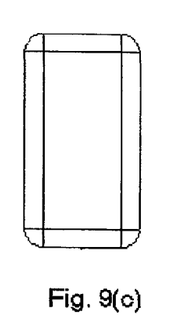
Figure 9D:
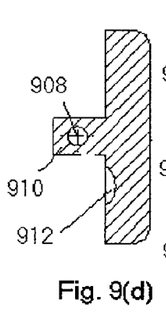
Figure 10:
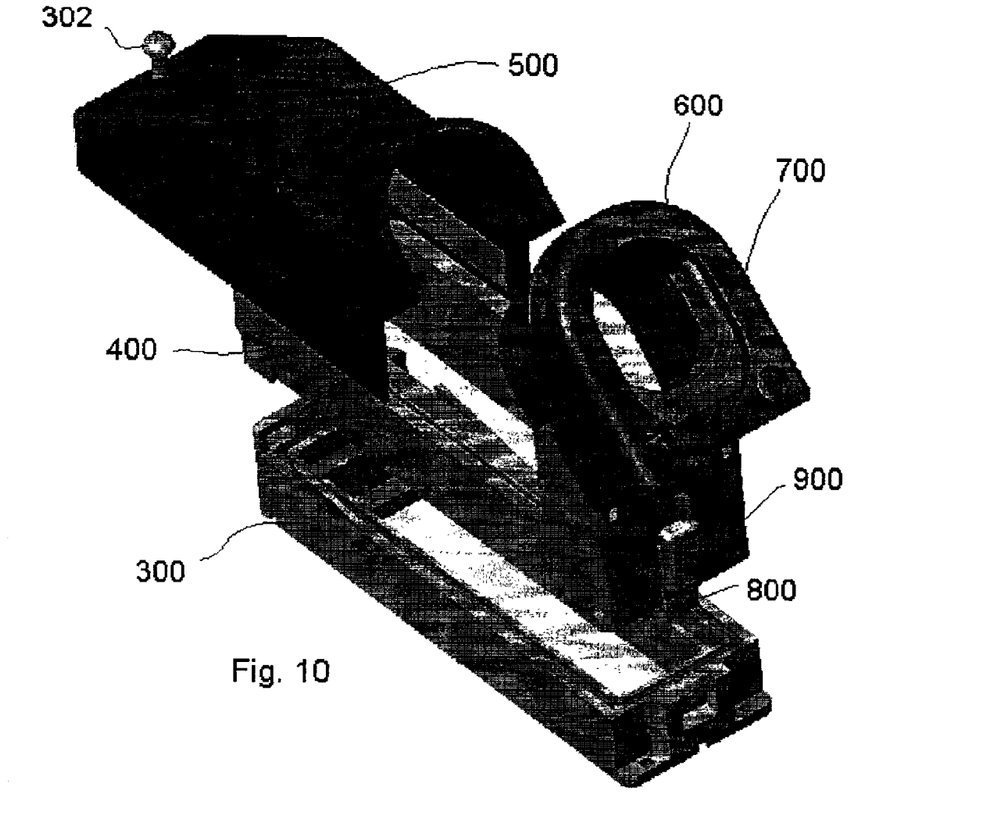
FIG. 10 is a perspective view of a preferred embodiment of the invention and a receiver.

The preferred embodiment of the modular test adapter further includes a bushing or collar 600 that has an oblong opening 608 through which patchcords may pass. The shape of the opening 608 may be as shown in FIG. 6(b), but may also be essentially any other shapes such as circular, hexagonal, rectangular, oval, etc. The shape of the opening 608 shown is FIG. 6(b) is the preferred shape because it is believed to more space for patchcords or cables than some other shapes such as circular but maintains the same device width as prior devices and provides for better clamping of the patchcords or cables than openings shaped as squares or rectangles. The bushing 600 fits onto the assembled base and cover and secured using two screws placed through screw holes 604.

Figure 3A:
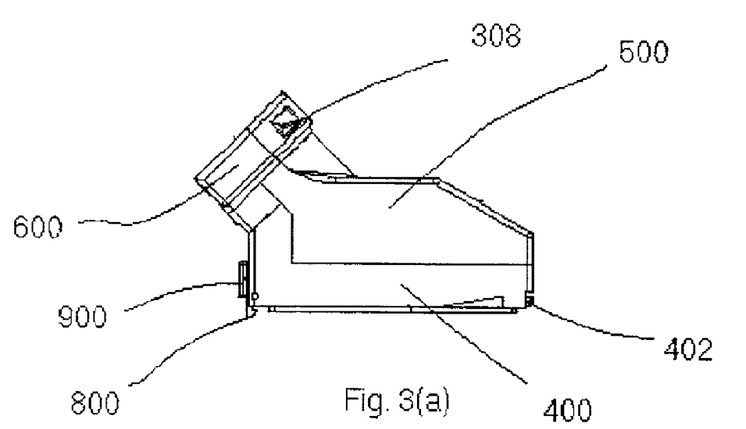
FIGS. 3(a), (b), (c), (d), and (e) respectively are side, front, top, cross-sectional, and angular views of an assembled modular test adapter in accordance with a preferred embodiment of the present invention.
Figure 3B:
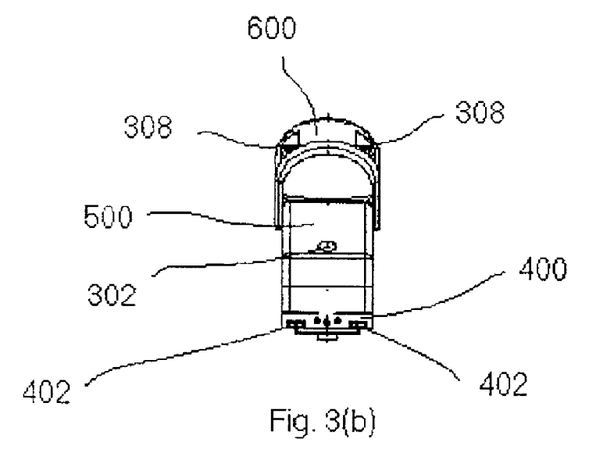
Figure 3C:
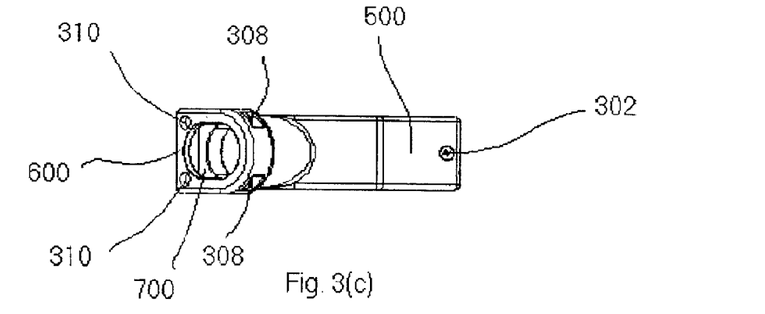
Figure 3D:
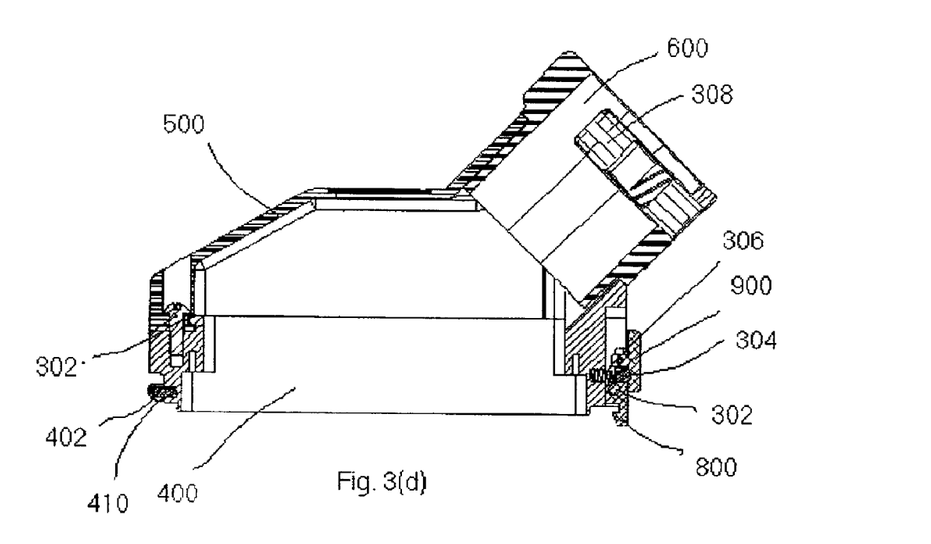
Figure 3E:
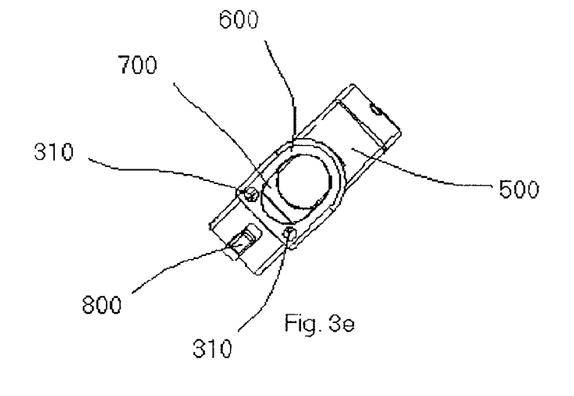

The top of the bushing 600 has screw holes 602 into which clamp screws are placed. The interior of the bushing 600 includes slots on opposing sides for receiving a clamp 700. A clamp, shown in FIGS. 7(a)–(c), has an elongated shape, two screw holes 704 for receiving clamp screws, and a curved surface 702. In the preferred embodiment the clamp is placed such that its ends rest in the slots in the interior of the bushing 600 as shown in FIG. 3(c). The curved surface 702 may face the top of the bushing 600 for clamping large bundles of cables and may face the bottom of the bushing 600 for clamping small bundles of cables. The clamp screws 308 may be tightened or loosened to clamp the patchcords or cables between the clamp and the upper side of the opening 608 in the bushing. The bushing may be made of many different materials, but is preferably made of plastic.

With the previously described modular structure, easy access may be had to the contacts, patchcords, and modules installed in the test adapter. For example, a module may be removed from the test adapter by loosening the screws 308 on the cable clamp, removing the cover screw 302, sliding the cover 500 off the base 400, and then removing the module screws (not shown) from the base. Due to this easy module removal, modules may be easily replaced, thereby permitting spare or replacement patchcords or cables to be stored in a single module rather than having to keep an entire spare test adapter in storage. The easily removable cover also permits easy access to the pins and cables for troubleshooting while the test adapter is engaged in a receiver.

Structures other than tongue and groove structures may be used for placing the cover 500 onto the base 400, but the preferred tongue and groove structure provides for EMI shielding without the use of a gasket and may require fewer parts than other possible structures. For example, the test adapter base and cover could each include flat surfaces that would oppose each other when the cover is placed on the base and additional screws could be used to hold the cover in place. With such a structure, however, one likely would include an EMI gasket between the opposing flat surfaces of the base and cover.

Figure 11:
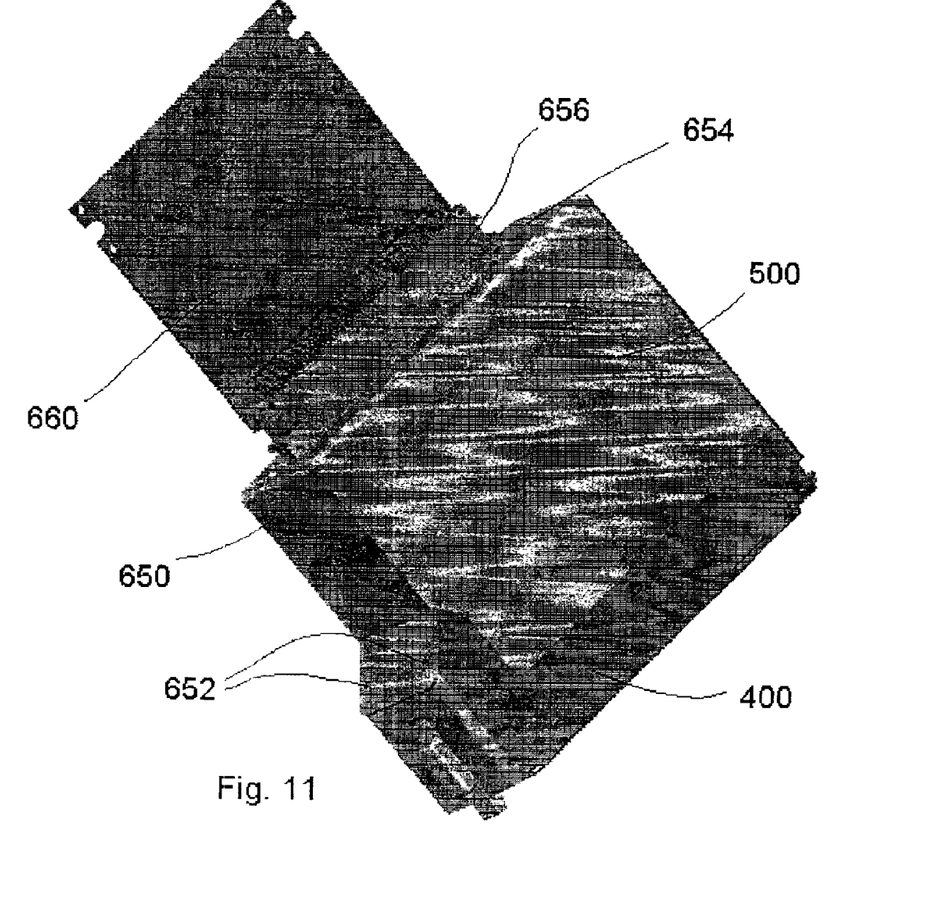
FIG. 11 is a perspective view of an example of an alternative embodiment.

Another embodiment of the invention is shown in FIG. 11. In this embodiment, the modular interface test adapter is designed to accommodate testing of circuit boards. The base 400 may be of the same structure as described in the previous embodiment. The cover 500 may attach to the base 400 in the same manner as previously described, but the shape of the cover 500 is modified to accommodate card support 650. The cover 500 may be made, for example, of aluminum or other sheet metal. The card support 650 includes two screw holes 652 to secure the card support to the base 400 and a screw hole 654 to secure the card support to the cover. The card support further includes a standard DIN connector 656 for edge testing a circuit board 660.

The foregoing description of the preferred embodiments of the invention has been presented for purposes of illustration and description. They are not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular uses contemplated. It is intended that the scope of the invention be defined by the claims appended hereto, and their equivalents.

What is claimed is:

1. A modular interface test adapter comprising:

a base comprising a housing having at least one connector module mounting hole and a tongue and groove structure along a substantial portion of a perimeter of said housing;

a cover removably mounted to said base, said cover having a tongue and groove structure mated with said tongue and groove structure of said base; and a bushing comprising a housing having an opening therein and a clamp; wherein said bushing is removably mounted to at least one of said cover and said base.

2. A modular test adapter according to claim 1, wherein said base further comprises a threaded hole; and said cover further comprises a hole aligned with said threaded hole in said base when said cover is mated to said base.

3. A modular test adapter according to claim 2, further comprising a screw for removably securing said cover to said base, wherein said screw passes through said hole in said cover and screws into said threaded hole in said base.

4. A modular interface test adapter according to claim 1 wherein said perimeter comprises a plurality of sides and said substantial portion of a perimeter comprises substantially all of at least one of said sides.

5. A modular interface test adapter according to claim 1 wherein said bushing is removably mounted to at least one of said base and said cover.

6. A modular test adapter according to claim 1, where said clamp is adjustable within slots in sides of said bushing.

7. A modular test adapter according to claim 1, further comprising a means for adjusting said clamp in said bushing.

8. A modular test adapter according to claim 1 wherein said clamp has an elongated shape with a first straight side and an opposing curved side.

* * * * *